(12) United States Patent
Dueber et al.

(10) Patent No.: US 7,524,617 B2
(45) Date of Patent: *Apr. 28, 2009

(54) LOW-TEMPERATURE CURABLE PHOTOSENSITIVE COMPOSITIONS

(75) Inventors: Thomas E. Dueber, Wilmington, DE (US); Michael W. J. West, Wilmington, DE (US); Kuppusamy Kanakarajan, Dublin, OH (US); Brian C. Auman, Pickerington, OH (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 22 days.

This patent is subject to a terminal disclaimer.

(21) Appl. No.: 10/997,701

(22) Filed: Nov. 23, 2004

(65) Prior Publication Data
US 2006/0110678 A1    May 25, 2006

(51) Int. Cl.
G03F 7/028 (2006.01)
G03F 7/20 (2006.01)
G03F 7/30 (2006.01)
G03F 7/32 (2006.01)
G03F 7/40 (2006.01)

(52) U.S. Cl. .................. 430/311; 430/325; 430/330; 430/270.1; 430/281.1; 430/285.1; 430/283.1

(58) Field of Classification Search ............. None
See application file for complete search history.

(56) References Cited

U.S. PATENT DOCUMENTS

| 3,469,982 | A | | 9/1969 | Celeste |
| 3,547,730 | A | | 12/1970 | Cohen et al. |
| 4,071,367 | A | | 1/1978 | Collier et al. |
| 4,127,436 | A | | 11/1978 | Friel |
| 5,536,620 | A | | 7/1996 | Dueber et al. |
| 5,643,657 | A | | 7/1997 | Dueber et al. |
| 5,677,393 | A | | 10/1997 | Ohmori et al. |
| 5,728,505 | A | | 3/1998 | Dueber et al. |
| 5,856,059 | A | * | 1/1999 | Hagiwara et al. ........... 430/196 |
| 6,218,074 | B1 | | 4/2001 | Dueber et al. |
| 6,364,465 | B1 | * | 4/2002 | Chandrasekaran ........... 347/65 |
| 6,482,569 | B1 | * | 11/2002 | Matsuoka et al. ......... 430/283.1 |

FOREIGN PATENT DOCUMENTS

JP    04-023879    1/1992
JP    10-212468    8/1998

OTHER PUBLICATIONS

U.S. Appl. No. 11/271,267, filed Nov. 10, 2005, Dueber et al.

* cited by examiner

*Primary Examiner*—Sin J. Lee

(57) ABSTRACT

The invention relates to low-temperature curable photosensitive compositions containing a polyamic acid, which compositions are developable in aqueous alkaline solutions and are curable, at a temperature of at least 160° C. and up to 200° C., to low modulus polyimides suitable for use in electronic circuitry applications, and which are particularly suitable for use in flexible circuit applications where low curl, low temperature curing, and good adhesion is a significant advantage.

9 Claims, No Drawings

LOW-TEMPERATURE CURABLE PHOTOSENSITIVE COMPOSITIONS

BACKGROUND OF THE INVENTION

1. Field of the Invention

The invention relates generally to low-temperature curable photosensitive compositions containing polyamic acids, and, more particularly, to low-temperature curable photosensitive compositions containing polyamic acids, which compositions are developable in aqueous alkaline solutions and are curable to low modulus polyimides suitable for use in electronic circuitry applications.

2. Background Information

A printed circuit board may be single-sided with a conductive element on one side of a base (substrate), or double-sided with a conductive element on both sides of a substrate. The conductive element, which may consist of a metal layer of copper foil for example, can be applied to the substrate (i.e., a dielectric film layer) with an adhesive. In another example, the metal can be plated directly to the substrate via electrolytic deposition. Circuit lines, typically protected by a punched coverlay or a photo-processed solder mask, are formed by removal of selected portions of the conductive element on the circuit board using photoresist radiation exposure, development and chemical etching process steps. The punched coverlay, or the photo-processed solder mask, may also function as an insulating, dielectric coating layer.

Protective dielectric coatings used to encapsulate circuitry are described in U.S. Pat. Nos. 3,469,982 and 3,547,730, may be in the form of a film layer disposed between a removable protective cover sheet and a temporary support film. After removal of the cover sheet, the film layer can be laminated on a copper substrate, imagewise exposed to actinic radiation through the support film, and developed with organic solvents or aqueous solutions to form a defined resist layer. The defined resist layer may be thereafter modified by selectively etching, electroplating, or treating with solder.

As the electronics industry is continually driven toward faster, more reliable and compact devices, there is a concomitant need for flexible materials that can withstand manufacturing processes and varying environmental conditions while maintaining integrity and stability. Suitable flexible materials are needed to accommodate limited space availability, i.e., when the circuit is folded or bent, either once, for example, in a camera or video cassette recorder (VCR), or multiple times, for example, in a computer disk drive, while retaining functionality.

There remains a need for a flexible material for use in electronic circuitry applications.

SUMMARY OF THE INVENTION

The invention relates to low-temperature curable photosensitive compositions containing a polyamic acid, which compositions are developable in aqueous alkaline solutions and are curable, at a temperature of at least 160° C., and up to 200° C., to low modulus polyimides suitable for use in electronic circuitry applications. These compositions can be particularly suitable for use in flexible circuit applications where low curl, and low temperature bonding, is a significant advantage.

A low-temperature curable photosensitive composition is provided, and includes a polyamic acid, derived from one or more aromatic dianhydrides and one or more aliphatic diamines. The polyamic acid can be developable in aqueous carbonate and can be cured to a polyimide having a low modulus of less than 2 GPa. The composition comprises an ethylenically unsaturated photo monomer mixture comprising a compound selected from the group consisting of amine (meth)acrylates, amine methacrylamides, and combinations thereof; and, a non-amine-containing (meth)acrylate compound; a photo initiator; and a sensitizer.

The one or more aromatic dianhydrides are selected from 4,4'-oxydiphthalic anhydride, 1,2,4,5-benzenetetracarboxylic anhydride, 4,4-(4,4'-isopropylidenediphenoxyl)-bis(phthalic anhydride), benzophenonetetracarboxylic dianhydride, 3,3',4,4'-diphenylsulfone tetracarboxylic dianhydride, 2,2'-bis-(3,4-dicarboxyphenyl)hexafluoropropane dianhydride, and combinations thereof. The one or more aliphatic diamines are selected from the group consisting of: hexamethylene diamine, 1,12-diamino-dodecane, 1,10-decanediamine, 1,3-bis(3-aminopropyl)-tetramethyldisiloxane, isophoronediamine, and combinations thereof.

The amine methacrylates and methacrylamides are selected from the N-methylamino-bis-(ethyl methacrylate), dimethylaminopropyl methacrylamide, dimethylaminoethyl methacrylate, acrylated amine oligomer, and combinations thereof. The non-amine containing (meth)acrylate compound is selected from polyethylene glycol (200) diacrylate, 1,6-hexanediol diacrylate, 1,6-hexanediol dimethacrylate, triethyleneglycol diacrylate, triethyleneglycol dimethacrylate, 1,10-decanediol diacrylate, 1,12-dodecanediol diacrylate, oxyethylated phenol acrylate, and combinations thereof.

The polyamic acid may be derived from one or more aromatic dianhydrides in combination with one or more aliphatic dianhydrides. The polyamic acid may also be derived from one or more aliphatic diamines in combination with less than 25 mole percent of one or more aromatic diamines. The polyamic acid is developable in 1 percent aqueous sodium carbonate or potassium carbonate.

The photo initiator is selected from benzophenone, Michier's ketone, ethyl Michler's ketone, p-dialkylaminobenzoate alkyl esters, thioxanthones, hexaarylbiimidizoles, benzoin dialkyl ethers, 2-methyl-1-[4-(methylthio)phenyl]-2-(4-morpholinyl)-1-propanone, 2-(o-chlorophenyl)-4,5-bis(m-methoxyphenyl)-imidazole dimer; 1,1'-biimidazole, 2,2'-bis(o-chlorophenyl)-4,4',5,5'-tetraphenyl-(Bis(2-o-chlorophenyl-4,5-diphenylimidazole)), 1H-imidazole, 2,5-bis(o-chlorophenyl)-4-[3,4-dimethoxyphenyl]dimer, and combinations thereof.

The sensitizer is selected from bis-p-diethylaminobenzophenone, ethyl Michler's ketone; isopropylthioxanthone, coumarins, including 2,3,6,7-tetrahydro-1,1,7,7-tetramethyl-11-oxo-1H,5H,11H-(1)benzopyrano[5,7,8-ij]quinolizine-10-carboxylic acid ethyl ester, bis(p-dialkylaminobenzylidene) ketones, arylidene aryl ketones, N-alkylindolylidene alkanones, N-alkylbenzo-thiazolylidene alkanones, methylene blue, and combinations thereof.

An amine(meth)acrylate and a non-amine-containing (meth)acrylate may be present in the composition in substantially equal dry weight % amounts.

The composition may further include an adhesion promoter, selected from 3-mercapto-1H-1,2,4-triazole, 5-amino-1,3,4-thiadiazole-2-thiol, 2-mercaptobenzimidazole 2-(2'-hydroxy-5-methacrylyloxy-ethylphenyl)-2H-benzotriazole, polybenzimidazole, and combinations thereof.

The composition can be cured at a temperature of at least 160° C., and up to 200° C., for about one hour to obtain a cured (imidized) composition comprising a low-modulus polyimide having a modulus of less than 2 GPa. The low-modulus polyimide can have a glass transition temperature of 90° C. to 100° C., and a coefficient of thermal expansion of 70 ppm/° C. to 85 ppm/° C.

A method for preparing a low-temperature curable photosensitive composition is provided and includes the steps of: reacting one or more aromatic dianhydrides with one or more aliphatic diamines with a dry solvent to form a polyamic acid solution; providing an ethylenically unsaturated photo monomer mixture, including a compound selected from: amine (meth)acrylates, amine methacrylamides, and combinations thereof; and, a non-amine-containing (meth)acrylate compound; adding the photo monomer mixture, a photo initiator, and a sensitizer to the polyamic acid solution to form a photosensitive composition; exposing the photosensitive composition to actinic light to form an exposed composition; and developing the exposed composition in 1% aqueous carbonate at 80° C.

The method may further include the steps of: adding an adhesion promoter or dye to the photosensitive composition; coating the photosensitive composition on a releasable support sheet to form a coated composition; or laminating the coated composition to a printed circuit substrate.

A method for preparing a low-modulus polyimide includes the step of: curing a composition prepared according to the above-described method at a temperature of at least 160° C. and up to 200° C. for about one hour to obtain a low-modulus polyimide having a modulus of less than 2 GPa. The low-modulus polyimide may form an adhesive layer in an electrical circuit.

A method for applying to a substrate a photosensitive composition includes the step of laminating the above-described photosensitive composition to a substrate using hot roll lamination with roll temperature at 50° C. with N-methylpyrrolidone liquid assist.

The cured composition may be disposed on a surface of a substrate, and exhibits low curl and remains substantially flat. The composition may also be a photoimageable coating on a surface of a rigid or flexible substrate.

DETAILED DESCRIPTION OF THE INVENTION

The invention relates to low-temperature curable photosensitive compositions containing a polyamic acid, which compositions are developable in aqueous alkaline solutions and are curable, at a temperature of at least 160° C., and up to 200° C., to low modulus polyimides. These polyimide-based compositions are suitable for use in electronic circuitry applications and are particularly suitable for use in flexible circuit applications where low curl, and low temperature cure, is a significant advantage.

The low-temperature curable photosensitive composition includes a polyamic acid. According to an aspect of the invention, the polyamic acid is derived from one or more aromatic dianhydrides and one or more aliphatic diamines.

Aromatic dianhydrides suitable for use in making the polyamic acid include 4,4'-oxydiphthalic anhydride, 1,2,4,5-benzenetetracarboxylic anhydride, 4,4-(4,4'-isopropylidenediphenoxyl)-bis(phthalic anhydride), benzophenonetetracarboxylic dianhydride, 3,3'4,4'-diphenylsulfone tetracarboxylic dianhydride, 2,2'-bis-(3,4-dicarboxyphenyl) hexafluoropropane dianhydride, and combinations thereof. Exemplary uses of 4,4'-oxydiphthalic anhydride are found in the Examples section below.

Aliphatic diamines suitable for use in making the polyamic acid include 1,6-hexamethylene diamine, 1,7-heptamethylene diamine, 1,8-octamethylenediamine, 1,9-nonamethylenediamine, 1,10-decamethylenediamine (DMD), 1,11-undecamethylenediamine, 1,12-dodecamethylenediamine (DDD), 1,16-hexadecamethylenediamine, 1,3-bis(3-aminopropyl)-tetramethyldisiloxane, isophoronediamine, and combinations thereof. Exemplary uses of 1,12-diaminododecane and 1,3-bis(3-aminopropyl)-tetramethyldisiloxane are found in the Examples. Other aliphatic diamines suitable for practicing the invention include those having six to twelve carbon atoms or a combination of longer chain and shorter chain diamines so long as both developability and flexibility are maintained. Long chain aliphatic diamines increase flexibility. On the other hand, as the chain is increased, developability can take longer. This can lead to forming a composition that may not develop well. Long chain aliphatic diamines also reduce modulus.

For example, where 1,6-hexamethylene diamine is employed no more than 80 mole percent should be used. The remaining 20 mole percent should include one or more of the alternative, longer chain diamines.

To obtain a polyamic acid solution according to one aspect of the invention, one or more aromatic dianhydrides are combined with a dry solvent. The drive solvent can be, for example, N-methyl pyrrolidone (NMP). A mixture is formed to which one or more diamines are added over a period of about one to four hours at a temperature below 40° C. Alternatively, one or more aliphatic diamines are combined with a suitable dry solvent (e.g. NMP) to form a mixture. The mixture can then have added to it one or more aromatic dianhydrides, over a period (about one to two hours) at a temperature below 40° C. The resulting polyamic acid solutions can be stirred for about two to twelve hours, without the application of heat, to ensure that the formation of the polyamic acid is complete.

Useful organic solvents for the synthesis of the polyimide compositions of the invention should be suitable for the polyamic acid synthesis and capable of dissolving the polyamic acid. The solvent should have a relatively low boiling point (e.g., below 225° C.) so that the photosensitive composition may be cured at a temperature of at least 160° C., and up to 200° C. Solvents used in the practice of the invention may be used alone or in combination with other solvents. Useful solvents include NMP and dimethylacetamide (DMAc). Other solvents may include N—N'-diethylformamide and dimethyl sulfoxide. Generally, DMAc or NMP are used due to the polarity of the polyamic acid, and these solvents have boiling points below 225° C.

The percent residual solvent remaining in the coated compositions is high compared to acrylic-based photoimageable coverlays. Between 30% and 40% of the weight of the "dried" coating is residual solvent. The coatings are dried at 80° C. for 10 minutes or until the coatings are not tacky. The residual solvent aids in plasticizing the polyamic acid and is also an aid to encapsulating the circuit traces during lamination. Removal of residual solvent is limited in the dried coating, in that too much heating of a polyamic acid converts it to a polyimide, which will concomitantly reduce developability when too much polyimide is formed.

According to an aspect of the invention, the polyamic acid is derived from one or more aromatic dianhydrides in combination with one or more aliphatic dianhydrides, to which one or more diamines are added. According to another aspect of the invention, the polyamic acid is derived from one or more aliphatic diamines in combination with less than 25 mole percent of one or more aromatic diamines.

Suitable aromatic diamines include: 2,2-bis(4-[4-aminophenoxy]phenyl)-propane (BAPP); 2,2-bis(4-[4-aminophenoxy]phenyl sulfone (BAPs); 2,2-bis(4-[3-aminophenoxy]phenyl sulfone (m-BAPs); 1,4-bis(4-aminophenoxy)

benzene; 1,3-bis(4-aminophenoxy)benzene, 1,3-bis(4-aminophenoxy)benzene; 1,3-bis(4-amino-phenoxy)propane; 1,4-bis(4-aminophenoxy)butane; and 1,5-bis(4-aminophenoxy)-pentane.

A suitable aliphatic dianhydride includes 5-(2,5-dioxotetrahydrol)-3-methyl-3-cyclohexene-1,2-dicarboxylic anhydride.

It has been found that it is advantageous to have high molecular weight polyamic acids so that the resulting cured polyimide has a high molecular weight, which increases the flexibility of the resulting cured composition. If the molecular weight of the polyamic acid becomes too high to permit good developability, however, the use of end caps may be useful in practicing the invention. It is to be understood, however, that one polyimide having a particular molecular weight may behave quite differently than another polyimide of a different composition of the same molecular weight.

In yet another aspect of the invention, an amine(meth)acrylate and a non-amine-containing (meth)acrylate are present in the composition in substantially equal dry weight percentage amounts. To obtain a photosensitive composition, photo monomers, a photo initiator, and a sensitizer are added to the polyamic acid solution. Ethylenically unsaturated photo monomers suitable for use in the invention include a mixture of at least one amine (meth)acrylate, or amine methacrylamide, and a non-amine-containing (meth)acrylate compound. Useful amine (meth)acrylate and amine methacrylamide compounds include N-methylamino-bis-(ethyl methacrylate), dimethylaminopropyl methacrylamide, dimethylaminoethyl methacrylate, acrylated amine oligomer, and combinations thereof. Useful non-amine containing (meth)acrylate compounds include polyethylene glycol (200) diacrylate, 1,6, hexanediol diacrylate, 1,6-hexanediol dimethacrylate, triethyleneglycol diacrylate, triethyleneglycol dimethacrylate, 1,10-decanediol diacrylate, 1,12-dodecanediol diacrylate, oxyethylated phenol acrylate, and combinations thereof. Particularly suitable amine di(meth)acrylates include an acrylated amine oligomer, sold under the tradename EBECRYL 7100, available from UCB Chemicals Corporation of Smyrna, Ga., and N-methyldiethanolamine dimethacrylate, available from Sartomer Company of Exton, Pa. Amine (meth)acrylates catalyze the conversion of polyamic acids to polyimides, which lowers the cure temperature and provides a higher percentage of conversion of polyamic acid to polyimide. The amount of amine (meth)acrylates used should be kept to a minimum to avoid lowering adhesion with sulfuric acid testing. Other particularly suitable di(meth)acrylates include hexanediol dimethacrylate, available from Sartomer Company under the product codes SR239 and SR259, which products are polyethylene glycol 200 diacrylates.

The amine (meth)acrylate photo monomers form a salt with the polyamic acid, which renders the photo monomer compatible with the polyamic acid (binder). If the photo monomer used lacks an amine functionality, a suitable amount of amine (meth)acrylate is added to the photo monomer mixture.

The photopolymer must be able to withstand aqueous carbonate development. In this regard, the use of di(meth)acrylates renders the photosensitive composition less susceptible to attack by a developer agent. The amount of di(meth)acrylate used influences the flexibility after cure, i.e., lower amounts improve flexibility.

Suitable photo initiators for use in the invention include benzophenone, Michler's ketone, ethyl Michler's ketone, p-dialkylaminobenzoate alkyl esters, thioxanthones, isopropyl thioxanthone, hexaarylbiimidizoles, benzoin dialkyl ethers, 2-methyl-1-[4-(methylthio)phenyl]-2-(4-morpholinyl)-1-propanone, 2-(o-chlorophenyl)-4,5-bis(m-methoxyphenyl)-imidazole dimer; 1,1'-biimidazole, 2,2'-bis(o-chlorophenyl)-4,4',5,5'-tetraphenyl-(Bis(2-o-chlorophenyl-4,5-diphenylimidazole)), 1H-imidazole, 2,5-bis(o-chlorophenyl)-4-[3,4-dimethoxyphenyl]dimer, and combinations thereof.

Suitable sensitizers for use in the invention include bis-p-diethylamino-benzophenone, ethyl Michler's ketone; isopropylthioxanthone, coumarins, including 2,3,6,7-tetrahydro-1, 1,7,7-tetramethyl-11-oxo-1H,5H, 11H-(1)benzopyrano[5,7,8-ij]quinolizine-10-carboxylic acid ethyl ester, bis(p-dialkylaminobenzylidene) ketones, arylidene aryl ketones, N-alkylindolylidene alkanones, N-alkylbenzo-thiazolylidene alkanones, methylene blue, and combinations thereof.

A suitable combination of photo initiator and sensitizer is 2,2'-bis(o-chlorophenyl)-4,4',5,5'-tetraphenyl-(Bis(2-o-chlorophenyl-4,5-diphenylimidazole)) and ethyl Michler's ketone (EMK). The amount of EMK may be adjusted to obtain optimum light penetration through the coating.

The resulting photosensitive composition is filtered, and may be applied to a releaseable support sheet to form a coating. The coating is dried sufficiently so that it is not tacky, and is refrigerated until ready to be used as a photoimagable coverlay. A suitable releaseable support sheet may be selected from polyester and silicone-treated polyester. A removable cover sheet may also be laminated on the top surface of the coated composition. The cover sheet may be composed of polyethylene or polypropylene. At least one surface of the removable cover sheet may have a matte or an embossed finish. The coating, with releasable support sheet and removable cover sheet, may suitably be rolled up during storage without damaging the coating.

To use the composition as a photoimageable coverlay, the composition may be laminated onto a suitable substrate, typically a flexible circuit substrate, to form a laminate. The laminate is exposed to actinic radiation through a negative mask to form a resist layer. The unexposed areas of the laminate are developed in 1% aqueous sodium or potassium carbonate generally at 80° C.

Due to the adverse environmental impact of certain solvents, aqueous-alkaline developing systems are preferred. Alkaline developers useful in the invention include aqueous sodium carbonate and potassium carbonate. These developers can have less impact on the environment and can be lower in cost. Other suitable aqueous alkaline developers may also be used in practicing the invention, for example, tetramethyl ammonium hydroxide, for use in semiconductor applications, where sodium or potassium ions must be avoided.

The development process generally uses a processor that has a spray developer section (the aqueous carbonate solution) and a spray water rinse section. The samples go through the processor on a conveyor belt. Exposed areas are photo cross-linked and become photo-hardened so that they resist attack and removal by the developer.

Optionally, a dye may be added to the composition prior to coating to ensure that the non-exposed areas are visible, and the removal of these areas can be readily ascertained.

An adhesion promoter may also be optionally added to the composition to improve adhesion to the substrate. Suitable adhesion promoters include: 3-mercapto-1H-1,2,4-triazole, 5-amino-1,3,4-thiadiazole-2-thiol, 2-mercaptobenzimidazole 2-(2'-hydroxy-5-methacryloxy-ethylphenyl)-2H-benzotriazole, polybenzimidazole, and combinations thereof. Of the above, 3-mercapto-1H,2,4-triazole not only adheres well to copper, but can increase photo speed.

The low-modulus polyimides, according to the present invention, have a glass transition temperature of between and including any two of the following numbers, 90, 92, 94, 96, 98 and 100° C. These polyimides can also have a CTE of between and including any two of the following numbers, 70, 72, 74, 76, 78, 80, 82, 84 and 85 ppm/° C. In view of these low-modulus polyimides, upon the proper application of pressure and temperature, these materials, as cured compositions, may be used also as an adhesive layer.

The invention may be applied to any suitable substrate, regardless of the CTE of the underlying material, due to the low modulus of the polyimide. Although substrates available from the present assignee are disclosed, alternative substrates suitable for flexible applications may also be used. Typically, the substrate includes a temporary support film. The support film can support the substrate and can be selected from polyolefins, vinyl polymers, cellulose esters and polyesters, especially polyethylene terephthalate having a thickness of from 12 to 50 microns. The invention is then applied as a dry film polyamic acid composition at a thickness of about 10 to 50 µm (0.4 to 2 millimeters) depending upon the thickness of the circuit traces.

A suitable flexible substrate for use in the invention is PYRALUX AP, available from E.I. du Pont de Nemours and Company of Wilmington, Del. PYRALUX AP double-sided copper-clad substrate is an all-polyimide adhesive-less composite of polyimide film on copper foil. The three-layer composite substrate (thin layer of polyimide adhesive on both sides of a high Tg and high modulus polyimide core) is used in a wide variety of flexible circuitry applications, including multilayer flexible and rigid-flexible applications requiring advanced material performance, temperature resistance, and high reliability, in addition to thin dielectric profiles, long-term thermal exposure performance and compatibility with a harsh environment. The relatively low CTE of the PYRALUX® AP substrate is about 23 ppm/° C. A suitable thickness is 1.0 mil to 2.0 mil (25 µm to 50 µm). When using the substrate in practicing the invention, typically one side of the copper foil is removed by etching or other suitable techniques.

An alternative suitable flexible substrate for use in the invention is PYRALUX® AC, also available from E.I. du Pont de Nemours and Company of Wilmington, Del. The PYRALUX® AC single-sided copper-clad substrate is an all-polyimide composite of polyimide film on copper foil. The single-sided copper-clad substrate (a high modulus, high Tg single layer of polyimide) is used in various circuitry applications, including use as a display driver, multilayer digital camera, or rigid-flex camcorder circuits requiring a thin, lightweight and high-density circuitry with chip-on-flex attachment. The relatively low CTE of the PYRALUX® AC substrate is about 23 to 24 ppm/° C. The polyimide thickness is available from 1.0 mil to 1.8 mil (25 µm to 45 µm). The rolled-annealed or electro-deposited copper foil weights are available from 0.5 to 1 oz/ft$^2$ (18 to 35 µm). Generally, treatment of the polyimide surface improves adhesion to a subsequently bonded film layer.

It is to be understood that although the invention is described for use on a single-sided flexible substrate, the invention may be used on double-sided flexible circuits, and on rigid substrates, or may be used in rigid-flex applications, depending upon the desired end use.

Advantageously, the developed laminate, including the polyamic acid composition according to an aspect of the invention, may be cured to a polyimide at a temperature of at least 160° C., and up to 200° C. Curing can take about one hour to obtain a relatively fully cured composition comprising a low-modulus polyimide having a modulus of less than 2 GPa. This cure temperature can be advantageous because the polyamic acid is converted to a polyimide at a lower temperature than most polyimides. This can be especially advantageous if some of the flexible circuit materials used in conjunction with the materials of the present invention have a CTE lower than the polyimide. In the industry, higher temperatures are typically required for similar conversions of many polyamic acids to polyimides. These curing temperatures can range between at least 200° C. to 300° C. or higher, especially for high Tg, high-modulus polyimides.

An 'all-polyimide' substrate with the cured composition according to the present invention adjacent to another polyimide layer exhibits low curl and remains substantially flat due to the low-modulus polyimide formed upon cure. Low curl means deformation of less than 2 mils for the test samples and procedures described below. It was surprisingly found that, although the CTE of the resulting polyimides was relatively high, i.e., 70 ppm/° C. to 85 ppm/° C. when compared to that of the underlying substrate having a CTE of 23 or 24 ppm/° C., the composite remained substantially flat in spite of the CTE mismatch, i.e., one would typically need a flexible solder mask with a CTE that matched or was close to the CTE of the underlying substrate. Also, most polyimides are generally higher modulus, whereas most acrylics are generally lower modulus. With an acrylic-based photoimageable coverlay, curl is not a significant concern due to the lower modulus and lower cure temperature needed. If a material has a high Tg, typically there is a high modulus asociated therewith. A material with a high Tg and high modulus may pose a problem, unless the CTE of the material matches, or is close to, the CTE of the polyimide in the flexible substrate, otherwise the flexible circuit will curl. If the material has a low-modulus, however, there is no need to match the CTE of the material to that of the substrate. Material having a low modulus and low Tg is less thermally stable than a high modulus, high Tg material, such as a high Tg polyimide film, however, so there is a tradeoff in properties.

Advantageously, the composition according to the invention is stable and does not require high temperature to cure. The compositions have the advantage of requiring low temperature cure of at least 160° C. because of the low Tg of the polyimides ranging from 90° C. to 100° C. The polyimides according to an aspect of the invention advantageously have a low modulus, which is less than 2 GPa. The polyimides of the Examples have a modulus as low as 1.5 GPa.

Depending upon the desired application, the invention has certain advantages (over acrylic-based photo-imagable coverlay). The advantages of the invention include relatively high temperature performance relative to acrylics (but not as thermally stable as high Tg polyimide), less off-gassing, and improved chemical resistance. Although the cost of polyamic acids may be relatively high (as compared to acrylic-based PICs), the cost is significantly reduced when the flexible, cured composition according to an aspect of the invention is applied to only one side of the circuit.

As illustrated in the Examples, non-photosensitive polyamic acids 1 to 6 were unacceptable for single layer coating compositions because the photo cross-linked areas did not adhere to the flexible circuit substrates during development. Some of the polyimides derived from these polyamic acids had CTEs close to that of the polyimide base substrate, which would typically give low curl after cure, but the polyimides had high Tg so curing would require a temperature of over 300° C. Due to the poor adhesion on development and the high cure temperature, these polyamic acids were unacceptable. As illustrated in the Examples, non-photosensitive polyamic acids 7 to 11 were also unacceptable because the CTE of the resulting polyimides was higher than the polyimide of the base laminate and the resulting polyimides also had a high modulus, causing a positive curl upon cure.

As further illustrated in the Examples, polyamic acids 16 to 18 were unacceptable for reasons which include poor developabililty. Even when an acceptable polyamic acid was used, it was found that using only N-methyldiethyl-amino dimethacrylate (MADEMA) as the sole photo monomer resulted in poor performance with sulfuric acid testing.

Flexible printed circuits must be capable of withstanding a variety of tests depending upon the desired application. The following description summarizes the various tests to which the printed circuits containing the compositions according to the invention as set forth in the Examples were subjected.

As mentioned above, flexible printed circuits must be capable of withstanding a variety of tests depending upon the desired application, which in turn typically governs the material(s) used for the substrate upon which the circuit is formed. In a stringent application (to accommodate limited space availability while retaining functionality), the circuit may be folded or bent, either once, for example, in a camera or video cassette recorder (VCR), or multiple times, for example, in a computer disk drive. In some applications, a flexible circuit is combined with a rigid circuit to form a flex-rigid multilayer printed circuit.

Printed circuits must also maintain their integrity in use and during the lifetime of the circuit. Thus, the various layers of which a printed circuit may consist should suitably adhere to each other and to the circuitry lines.

In view of the foregoing, the end-use tests for flexible printed circuits focus mainly on adhesion and the capability to withstand single or multiple bends. The following processes and tests used which support the Examples according to the invention are described below.

In one embodiment of the present invention (a 'dry film lamination'), a pre-formed, dry-film, photopolymerizable coating composition with a removable cover sheet formed of, for example, polyethylene or polypropylene, was applied to a flexible substrate containing a printed circuit pattern, after removal of the cover sheet from the coating composition. The removable cover sheet may be used to protect the coating composition during storage or transport. On a surface of the substrate is a pre-cleaned, copper-printed circuit pattern which is formed using a solder mask vacuum laminator or using an N-methylpyrrolidone (NMP) liquid assist with a RISTON HRL-24 Laminator. On an opposing surface of the flexible substrate is a temporary support film. The roll temperature can vary from room temperature to 50° C. The coating composition can range in thickness from 10 to 50 microns (0.4 to 2 mils), depending upon the thickness of the printed circuitry lines. Although the flexible substrate is typically imagewise exposed to actinic radiation through a temporary support film, in some instances, the temporary support may be removed before imaging to improve resolution and other such properties.

Generally, when a dry film is laminated (without using a liquid assist) to a printed circuit substrate having a low circuit relief, measures must be taken to eliminate entrapped air which collects, for example, around circuitry lines. Entrapped air may be eliminated by the vacuum lamination process of Fiel, U.S. Pat. No. 4,127,436, or by the grooved roll lamination process of Collier et al., U.S. Pat. No. 4,071,367. A Solder Mask Vacuum Laminator (SMVL) may also be useful in eliminating entrapped air, but use is limited to atmospheric pressure after an evacuation cycle. If a pressure higher than atmospheric is required, lamination with an SMVL can be followed by a hot press lamination, or alternatively, a vacuum press can be used for the lamination process.

Definitions

'Bend/Crease Test'—The "Bend and Crease" test used a substrate typically containing an MIT (Massachussetts Institute of Technology) flexural endurance pattern. The MIT pattern is a meander pattern (the circuit traces run parallel to each other and are connected at one end by 2 right angle turns so that the trace is a continuous one where most of the trace appears as closely spaced parallel lines) that has alternating one mm lines and spaces in the region to be tested. The sample substrate was creased in a 180° fold perpendicular to the direction of the lines and spaces. The substrate chosen for the test was of the same type to be used in actual production. The thickness and type of substrate (copper, adhesive) and the processing steps (pre-cleaning, lamination, curing, solder exposure) were replicated so that the results reflected a true simulation. For example, a typical substrate formed of polyimide (PYRALUX AP 8525) was used with the copper etched off of one side. The polyimide thickness of the substrate was 2 mils, and the copper thickness from the 0.5 oz/ft$^2$ copper layer was 18 micrometers. The CTE of the polyimide for this laminate substrate was 23 ppm/° C.+/−10%. The samples were bent and creased (by hand) in 10 different areas of each, and examined (using 10× magnification) for defects such as cracks or delaminations. Any reported defects constituted a failure. Sample substrates were evaluated "after cure" and "after solder," in which case samples were floated (with the surface containing the coverlay facing up) in 60/40 tin/lead solder at 288° C. for 30 seconds, cooled to room temperature, and evaluated as described above.

'Binder' as herein, means a polyamic acid composition (polymer precursor) that is thermally curable (with heat energy applied thereto). Binder is a term used to describe a polymer that acts to hold a composition together. A binder provides the final processed composition with many of its properties, for example, toughness or flexibility, depending upon the components of the polymer/monomeric composition and the particular application needs. In the present invention, the carboxylic acid groups of the binder provide solubility in an aqueous alkaline developing agent.

'Cross hatch adhesion'—The "Cross-Hatch Adhesion" test was performed according to the standards set forth in ASTM D-3359-79, Method B. Test substrates were selected to duplicate the material typically employed in the desired end-use, and were processed by following the actual processing steps.

To conduct the test, the substrates (typically PYRALUX AP 8525 with copper etched off of one side) were chemically pre-cleaned. In the Cross-Hatch Adhesion test, samples may also be used without any pre-cleaning or partial removal of the copper surface. All substrates described in the Examples were pre-cleaned. Samples to be chemically cleaned were passed through a series of steps beginning with immersion in VERSA CLEAN 415 for 2 minutes at 45° to 50° C., followed by immersion for 30 seconds in a deionized water bath. Thereafter, the samples were immersed in SURE ETCH 550 micro etching solution for one minute at 35° C., followed by a deionized water rinse for 30 seconds. The samples were then immersed in 10% sulfuric acid solution at room temperature for 30 seconds and given a final deionized water rinse. The chemically cleaned samples were dried and placed immediately in a nitrogen atmosphere until used.

The test areas consisted of a blank copper area and a blank adhesive area. The samples were tested for exposure "after cure" and "after solder" The term "after solder" refers to a process which simulates solder exposure during printed circuit board (PCB) fabrication. Typical "after solder" specimens were floated in 288° C. 60/40 tin/lead solder for 30 seconds. Residual solder was removed before evaluation. For each sample, the surface of the coverlay was scored with a 10 blade Gardco blade, the sample was rotated 90° and the surface re-scored to form a cross-hatch pattern consisting of 100 squares as cut into the coverlay surface. Adhesive tape was applied to the cross-hatch pattern, rubbed onto the surface to ensure good contact, and then was pulled away from the surface at a 90° angle in a smooth and continuous manner. The sample was examined using 10× magnification for delaminations. The amount of pick-off from the cutting blade of 1-2% was not considered a failure, but more than 2% pick-off exemplified a failure.

'CTE' (coefficient of thermal expansion) is the fractional increase in length per unit rise in temperature in the units ppm/° C.

'Cure' (or polymerize) is the change of a substance, for example, a polyamic acid, to an imidized polymer, for example, a polyimide, upon the application of thermal (heat) energy. Upon the application of heat, the polyamic acid undergoes ring closure (imidization) which produces water as a by-product via a condensation reaction. In addition, residual solvent from the coating composition and water from the conversion of the polyamic acid to polyimide is substantially eliminated.

'Curl' is the result of thermal stress, which is the product of the CTE mismatch of a flexible solder mask with the underlying material used as a base substrate. The modulus of a the flexible solder mask, the thickness of the flexible solder mask, and the difference in cure temperature between can all contribute to unwanted curl. All the above-mentioned factors influence the flatness of the flexible circuit containing a polyimide-based photoimageable coverlay on one side of a circuit. In single-sided circuits, where a counter-balancing photoimageable layer is not placed on both sides of a flexible circuit, curl may occur.

'Curl Assessment Test'—The "Curl Assessment" test employed sample substrates containing two MIT patterns that were prepared as described above for the "Bend and Crease" test, whereas the patterns were 1.62 inches across for each. After cure, the MIT samples were cut into 0.5 inch wide strips at an angle of 90° to the copper traces using a JDC Precision Sample Cutter from Thwing-Albert Instrument Co. The 0.5 inch×1.62 inch samples were placed onto a flat surface with the concave surface of the samples facing the flat surface. The distance from the high point of the sample to the flat surface was measured with a ruler in millimeters. A positive curl is denoted when the concave side is the side of the photoimageable coverlay. A negative curl is denoted when the concave side is the back side (the side opposite the coverlay) of the MIT test substrate laminate.

'Developing' or development means that the unexposed areas (areas that do not receive light exposure) of a photosensitive composition are capable of being removed (developed) by a developing agent. Upon removal of the unexposed areas, a negative relief pattern is formed on a substrate.

'Dielectric' means a substantially non-conducting layer of an electrical device that typically separates and insulates metal conductor elements from other elements or materials to form a three-dimensional interconnection structure. The polyimide according to an aspect of the invention is a dielectric polymer material.

'Encapsulation Test'—The "Encapsulation" test was used to evaluate the capability of a coverlay to adequately protect a substrate. The substrate and coverlay chosen for the test should represent those in end-use applications. The substrate was a circuit pattern (consisting of circuit lines) that had been processed with a coverlay by mimicking the actual manufacturing processes. After processing, the sample was evaluated (using 10× magnification) for any haloing, air entrapment, and/or delaminations, each of which constituted a failure. In the Encapsulation test, the sample also may be cross-sectioned along the edge of a circuit line, and evaluated under magnification to ensure that the coverlay adequately covers the area with no "soda-strawing" defects. There was no need to cross-section the samples in the present case. Before further processing steps occur, samples should pass the encapsulation test.

'Exposing' or exposure means subjecting a layer of a photosensitive composition to actinic radiation (typically UV) through a negative photomask to photo-image a desired pattern on the layer. The areas exposed to actinic light (photo-imaged areas) are capable of resisting subsequent attack and removal by subsequent chemical development as they have become photo-crosslinked (hardened).

'Flexible solder mask' (photoimageable coverlay), means a material disposed upon a substrate containing, for example, electronic circuit lines or traces. Actinic radiation is applied to the flexible solder mask through a photomask to form a desired pattern. As used herein, the term refers to a cured or uncured mask material. It is to be understood that once cured, the flexible solder mask provides protection for the underlying circuitry from subsequent treatment including, for example, molten solder.

'Low-temperature' (cure or curable) means a temperature of at least 160° C. and a temperature of up to, but not exceeding, 200° C.

'Modulus,' which is the ratio of stress divided by strain, may be characterized as high or low. High modulus means a rigid material not readily affected by heat, and low modulus means a material that is more readily softened with heat. Deformation of the material is measured in GPa.

'Photoimageable' means that a material has the capability of photo-crosslinking upon the application of, for example, actinic radiation.

'Photo monomer' means a precursor compound that contains, for example, a reactive acrylate or methacrylate functionality that reacts with free radicals formed (through a reaction with an initiator and generally a sensitizer) upon exposure to light to produce a photopolymer, which is generally a cross-linked photopolymer network upon cure. The use of photopolymer resists with acid functionality, for example, carboxyl groups, imparts aqueous processability. The presence of carboxyl groups, however, are disadvantageous in some subsequent processing steps due to their reactivity. By using a binder containing a reactive carboxylic functionality to impart aqueous processability, for example, polyamic acid, which does not contain an acrylate or methacrylate functionality, the binder does not become chemically incorporated into the photopolymer, but instead is physically entrapped within the cross-linked network, which entrapment protects the carboxylic acid functionality from attack or removal by a developing agent prior to cure, and the exposed, photo cross-linked areas remain after development.

'Photosensitive' means that a material is capable of reacting upon the application of actinic radiation (light energy).

'Resist' means a photosensitive composition that is not attacked by (resists) a particular chemistry. In an exposed negative working photoresist, the exposed portions are not attacked by the developer or developing agent. The term resist may also mean that a composition, for example, a resist layer, will resist or not be affected by exposure to high temperature molten solder.

'Time to clear'—The "Time to Clear" test was used to evaluate the retention time for adequately developing the coating composition (unexposed photoimageable coverlay). The coating composition was coated (laminated) onto a flexible substrate, and timed upon being placed in a one-percent aqueous sodium carbonate or potassium carbonate developer solution (which developer solution should be at the same temperature as that used in actual processing, typically 26° C. to 40° C.). The total "time to clear" was reported in seconds, beginning from the time the sample entered the developer solution and ending at the time at which the unexposed coverlay was washed off of the substrate. To ensure complete development during actual processing, exposed samples were generally developed at twice the reported time to clear.

'Tg' means glass transition temperature, and (as a simplistic definition) is the temperature at which a polymer undergoes a transformation (changes viscosity) from a rigid material to a flexible or viscous liquid (glass).

EXAMPLES

The advantageous properties of this invention can be further understood by reference to the following examples, which illustrate, but do not limit, the invention. The compounds used in the examples include:

| Initiators | |
|---|---|
| o-Cl HABI | Hexaarylbiimidazole |
| EMK | Ethyl Michler's Ketone |
| Other Ingredients | |
| MADEMA | PRO-754: N-methyldiethylamino dimethacrylate from Sartomer Company, Exton, PA |
| SR239 | 1,6-hexanediol diacrylate from Sartomer Company, Exton, PA |
| Sevron ® Blue GMF | Green dye from Crompton &Knowles Corp., Reading, PA |
| 3-MT | 3-mercapto-1H,2,4-triazole from Esprit Chemical Co., Rockland, MA |

Polyamic acids for the examples were prepared by combining a diamine or a mixture of diamines with a dry solvent, either N,N-dimethyl acetamide (DMAc) or N-methyl-2-pyrrolidinone (NMP) to form a mixture. The mixture was stirred mechanically under nitrogen as a dianhydride or mixture of dianhydrides were added over a period of 2 to 4 hours at a temperature held below 40° C. to form a polyamic acid solution. The solution was stirred for 2 to 12 hrs with no heat added. The solution was filtered through a 25 micrometer filter and refrigerated until ready to use. In the situation where the below-listed polyamic acids contain mostly aliphatic diamine, a reverse addition was used, i.e., a dianhydride(s) was dissolved in solvent and a diamine(s), for example, 1,6-hexamethylenediamine or 1,12-dodecyldiamine, was added over generally a two hour period.

Polyamic acid molecular weights were determined by gel permeation chromatography (GPC) and the relative weight average molecular weights were based on calibration with polystyrene standards. The various polyamic acids used in the examples, which contain the mole % of dianhydride and diamine in parentheses, are as follows:

Polyamic acid 1: biphenyl dianhydride (BPDA) (100)//p-phenyldiamine (PPD) (100); $M_W$ 34,000; $M_N$ 17,500; 25% solids in dimethylacetamide (DMAc); coefficient of thermal expansion (CTE) of polyimide is 10 ppm/° C., and glass transition temperature (Tg) of polyimide is 360° C.

Polyamic acid 2: BPDA(90)/1,2,4,5-benzenetetracarboxylic anhydride, i.e., pyromellitic dianhydride (PMDA) (10)//PPD(90)/4,4'-oxydianiline (ODA) (10); $M_W$ 44,000; $M_N$ 524,600; 25% solids in DMAc; CTE of polyimide is 18 ppm/° C., and Tg is 350° C.

Polyamic acid 3: BPDA(100)//PPD(80)/ODA(20); 15% solids in DMAc; CTE of polyimide is 25 ppm/° C., and Tg is 300° C.

Polyamic acid 4: PMDA(100)//ODA(100); 15% solids; CTE of polyimide is 22 ppm/° C., and Tg is 430° C.

Polyamic acid 5: PMDA(100)//PPD(60)/ODA(40); $M_W$ 367,000; $M_N$ 166,000; 12% solids; CTE of polyimide is 30 ppm/° C., and Tg is 375° C.

Polyamic acid 6: BPDA(100)//m-phenylenediamine (MPD) (100); 25% solids in DMAc; CTE of polyimide is 32 ppm/° C., and Tg is 310° C.

Polyamic acid 7: BPDA(100)//ODA(100); 25% solids in DMAc; CTE of polyimide is 45 ppm/° C., and Tg is 285° C.

Polyamic acid 8: PMDA(100)//1,3-bis(3-aminophenoxy)benzene (APB-133(100)); 25% solids in DMAC; CTE of polyimide is 50 ppm/° C., and Tg is 280° C.

Polyamic acid 9: 4,4'-oxydiphthalic anhydride (ODPA) (80)/PMDA(20)//1,3-bis(4-aminophenoxy benzene) (RODA) (70)/hexamethylene diamine (HMD) (30); $M_W$ 153,000; $M_N$ 76,300; 25% solids in DMAc; CTE of polyimide is 65 ppm/° C., and Tg is 190° C.

Polyamic acid 10: ODPA(100)//RODA(50)/HMD(50); 25% solids in DMAc; CTE of polyimide is 60 ppm/° C., and Tg is 170° C.

Polyamic acid 11: ODPA(80)/PMDA(20)//RODA(50)/HMD (50); $M_W$ 164,000; $M_N$ 81,100; 25% solids in DMAc; CTE of polyimide is 70 ppm/° C., and Tg is 178° C.

Polyamic acid 12: ODPA(100)//HMD(100); $M_W$ 44,700; $M_N$ 19,700; 25% solids in DMAc, CTE of polyimide 70 ppm/° C., and Tg is 100° C.

Polyamic acid 13: ODPA(100)//1,12-diaminododecane (DDA) (100); 25% solids in DMAc, CTE of polyimide is 70 ppm/° C., and Tg is 95° C.

Polyamic acid 14: ODPA(100)//DDA(95)/1,3-bis(aminopropyl)-tetramethyldisiloxane (TMDS)/(5); $M_W$ 44,700; $M_N$ 19,700; 25% solids in DMAc; CTE of polyimide is 80 ppm/° C., and Tg is 90° C.

Polyamic acid 15: ODPA(100)//DDA(75)/TMDS/(25); 25% solids in DMAc; CTE of polyimide is 85 ppm/° C., and Tg is 90° C.

Polyamic acid 16: 2,2-bis(4-[4-aminophenoxyl]phenyl)propane (BAPP) (100)/5-(2,5-dioxotetrahydrol)-3-methyl-3-cyclohexene-1,2-dicarboxylic anhydride (B-4400) (100); 25% solids in NMP.

Polyamic acid 17: 4,4'-(4,4'-isopropylidenediphenoxyl)-bis (phthalic anhydride)Ultem®-DA//DDA(94)/TMDS(5); 25% solids in NMP.

Polyamic acid 18: ODPA//PMDA/benzophenonetetracarboxylic dianhydride(BTDA) (50/25/25)/DDA/BAPP/TMDS(60/30/10); 25% solids in NMP.

The above polyamic acids were prepared to illustrate that the properties thereof lead to different amounts and direction of curl as discussed below. It is to be understood that none of the above polyamic acids individually are photosensitive, yet polyamic acids 1 to 11 are included to provide the reader with a further understanding of the polyamic acids used in the invention. The high Tg polyamic acids 1 to 6 in the photosensitive compositions did not have resistance to development, i.e., the coating washed off even though the compositions were exposed, so no data was possible. Polyamic acids 7 to 11 in the photosensitive compositions lead to high curl. In view of the aforementioned problems, polyamic acids 1 to 11 were coated onto a substrate without the addition of components to render the acids photosensitive. The amount of curl increased slightly with the addition of photo monomer, sensitizer, and initiator as can be seen by comparing Example 1-14 with Example 2.

In the instance where the molecular weight (Mw) and number average molecular weight (Mn) are not listed above for a polyamic acid, it is to be understood that the information concerning same was not obtained, as the actual weight and number are not necessary for an understanding of the invention.

Example 1

Examples 1-1 to 1-15)

Polyamic acids 1-1 to 1-15 were applied with a 4-mil doctor knife and coated on a 1-mil MYLAR removable cover sheet. The acids were dried in a forced draft oven for 4 min at 80° C. The dried samples were laminated onto a flexible circuit substrate containing a MIT copper test pattern. The lamination was done with NMP liquid assist using a hot roll lamination with a roll temperature of 50° C., at a pressure of 40 psi, and at a throughput of 0.6 meters/min. After lamination, the MYLAR cover sheet was removed, and the laminated coating compositions were baked at 80° C. for 10 minutes.

Examples 1-1 to 1-11 were cured in an oven. The oven had a temperature profile of 5° C./min from room temperature to 300° C. with a hold at 300° C. for 10 minutes. After curing, the samples were removed from the oven and cooled to room temperature.

Each of Examples 1-12 to 1-15 was cured at 160° C. for 1 hour, due to the polyimides having a low glass transition temperature. The thickness of the cured polyimide layer was approximately 80% of the coating thickness of the polyamic acid layer before cure, and each Example yielded a cured polyimide layer thickness of 1+/−0.1 mil. The MIT etched patterns were prepared from PYRALUX AP 8525 (all polyimide) laminates. Good encapsulation of all samples was obtained.

Examples 1-1 and 1-2 indicate a negative curl due to a high modulus and a lower CTE of the exemplary polyimide than the polyimide of the base laminate. Examples 1-3 to 1-6 have low curl numbers due to CTE of the polyimide being close to that of the polyimide of the base substrate. Examples 1-7 to 1-11 have a higher CTE than the polyimide of the base substrate and a modulus that is high enough to cause a positive curl. Examples 1-12 to 1-15 exhibit low curl although the polyimides have high CTE relative to the base laminate and is due to the low modulus of these polyimides. Advantageously, the polyamic acids used in Examples 1-12 to 1-15 require a low temperature cure of only 160° C. As discussed above, although the foregoing examples are not photosensitive compositions, the results point to the type of polyamic acids that will achieve low-curl cured polyimides attainable with a low-cure temperature.

| Example | Polyamic Acid | CTE (ppm/° C.) | Modulus (GPa) | Curl (mm) |
| --- | --- | --- | --- | --- |
| 1-1 | Polyamic acid 1 | 10 | 6.2 | −6 |
| 1-2 | Polyamic acid 2 | 18 | 5.9 | −3 |
| 1-3 | Polyamic acid 3 | 25 | 5.5 | −0.4 |
| 1-4 | Polyamic acid 4 | 22 | 3.1 | −1.8 |

-continued

| Example | Polyamic Acid | CTE (ppm/° C.) | Modulus (GPa) | Curl (mm) |
| --- | --- | --- | --- | --- |
| 1-5 | Polyamic acid 5 | 30 | 4.5 | 2 |
| 1-6 | Polyamic acid 6 | 32 | 4.8 | 2.2 |
| 1-7 | Polyamic acid 7 | 45 | 4.5 | 4 |
| 1-8 | Polyamic acid 8 | 50 | 2.8 | 3 |
| 1-9 | Polyamic acid 9 | 65 | 2.6 | 4 |
| 1-10 | Polyamic acid 10 | 60 | 2.6 | 8 |
| 1-11 | Polyamic acid 11 | 70 | 2.4 | 7.7 |
| 1-12 | Polyamic acid 12 | 70 | 2 | 2 |
| 1-13 | Polyamic acid 13 | 70 | 1.7 | 1.4 |
| 1-14 | Polyamic acid 14 | 80 | 1.5 | 0 |
| 1-15 | Polyamic acid 15 | 85 | 1 | 0 |

Example 2

Example 2 illustrates a polyamic acid curable to a low modulus polyimide at a temperature of 160° C. The resulting polyimide had good adhesion, flexibility, and chemical resistance, especially to sulfuric acid at 40° C. Flexible circuits using the composition as a photoimageable coverlay advantageously also exhibit low-curl and remain substantially flat. The addition of the dye to the composition aided in determining whether unexposed areas were developed in the developer chamber, but the addition of a dye is not required for the practice of the invention.

The photosensitive polyamic acid composition consisted of,

| Compounds | Grams |
| --- | --- |
| Polyamic acid 14 (25% in DMAc) | 25.001 |
| MADEMA | 0.635 |
| SR-239 | 0.635 |
| 0-CI-HABI | 0.234 |
| EMK | 0.020 |
| 3-MT | 0.031 |
| Sevron Blue GMF | 0.007 |

The polyamic composition was applied with an 8-mil doctor knife and coated on a one-mil (92D) MYLAR film and dried in a forced draft oven at 80° C. for 5.5 min. The 1.3 mil thick photosensitive coating was laminated to test substrates using a solder mask vacuum laminator at 85° C. Samples were exposed at 50 mj/cm$^2$. After exposure, the MYLAR cover sheet was removed and samples were baked at 80° C. for 10 min. The samples were developed in one-percent aqueous sodium carbonate solution at 80° F. with a time to clear of 14 seconds. The step-wedge image had 14 $\sqrt{2}$ steps and no development residue was present on the developed samples. MIT etched patterns prepared from PYRALUX AP 8525 all polyimide laminates were well encapsulated. The samples were cured for 1 hour at 160° C. The MIT samples passed bend/crease testing, crosshatch adhesion, and chemical resistance testing after immersion of the cured samples for 15 min in MEK, IPA, and 15% sulfuric acid at 40° C. The samples for curl measurement appeared nearly flat with the curl assessed at 4.6 mm. The thickness after cure was 1.0 mil.

COMPARATIVE EXAMPLES

The following examples illustrate the influence of the selected polyamic acid on developability or adhesion, and the effect on performance by using only one photo monomer.

Comparative Example 1

This comparative example illustrates that the selection of the polyamic acid has an impact on the developability. Polyamic acid 16 thus did not yield a usable coating.

| Compounds | Grams |
| --- | --- |
| Polyamic acid 16 (25% in NMP) | 25.00 |
| MADEMA | 0.635 |
| SR-239 | 0.635 |
| 0-CI-HABI | 0.234 |
| EMK | 0.020 |
| 3-MT | 0.031 |
| Sevron Blue GMF | 0.007 |

The composition was coated on a one-mil (92D) MYLAR film using a 6-mil doctor knife and dried in a forced draft oven at 80° C. for 8 minutes. The 0.9 mil thick photosensitive coating was laminated to test substrates using a solder mask vacuum laminator at 85° C. The MIT patterns were not totally encapsulated, and the samples did not develop in 100 seconds at 80° F.

Comparative Example 2

This comparative example also illustrates, as in comparative example 1, that the selection of the polyamic acid has an impact on the developability. Polyamic acid 17 yielded a coating that had poor developability, poor flexibility and poor adhesion after solder exposure.

| Compounds | Grams |
| --- | --- |
| Polyamic acid 17 (25% in NMP) | 25.00 |
| MADEMA | 0.635 |
| SR-239 | 0.635 |
| 0-CI-HABI | 0.234 |
| EMK | 0.020 |
| 3-MT | 0.031 |
| Sevron Blue GMF | 0.007 |

The composition was coated on a one-mil (92D) MYLAR film using a 4-mil doctor knife and dried in a forced draft oven at 80° C. for 8 minutes. The 0.7 mil thick photosensitive coating was laminated to test substrates using a solder mask vacuum laminator at 85° C. The MIT patterns were mostly encapsulated, and the samples required long development times of 79 seconds. The cured thickness was 0.5 to 0.6 mils. The test samples did not pass bend/crease testing on the MIT patterns and there was total delamination of the photoimageable coverlay after a solder float at 288° C.

Comparative Example 3

This comparative example also illustrates a polyamic acid that yields a photoimageable coverlay with poor adhesion after development, thus rendering impossible any further evaluation.

| Compounds | Grams |
| --- | --- |
| Polyamic acid 18 (25% in NMP) | 46.00 |
| MADEMA | 1.169 |
| SR-239 | 1.169 |
| 0-CI-HABI | 0.431 |
| EMK | 0.036 |
| 3-MT | 0.058 |
| Sevron Blue GMF | 0.013 |

The composition was coated on a one-mil (92D) MYLAR film using a 4-mil doctor knife and dried in a forced draft oven at 80° C. for 8 minutes. The 0.9 mil thick photosensitive coating was laminated to test substrates using a solder mask vacuum laminator at 85° C. The MIT patterns were encapsulated, and samples were exposed for 200 mj/sq cm and developed at 47 sec. The samples delaminated with development.

Comparative Example 4

This comparative example illustrates that using only one photo monomer results in poor performance with sulfuric acid testing.

| Compounds | Grams |
| --- | --- |
| Polyamic acid 14 (25% in DMAc) | 25.001 |
| MADEMA | 1.270 |
| 0-CI-HABI | 0.234 |
| EMK | 0.020 |
| 3-MT | 0.031 |
| Sevron Blue GMF | 0.007 |

The composition was coated on a one-mil (92D) MYLAR film using an 8-mil doctor knife and dried in a forced draft oven at 80° C. for 5.5 minutes. The 1.3 mil thick photosensitive coating were laminated to test substrates using a solder mask vacuum laminator at 85° C. Samples were exposed at 50 mj/cm$^2$. After exposure, the MYLAR cover sheet was removed and samples were baked at 80° C. for 10 min. The samples were developed in one-percent aqueous sodium carbonate solution at 80° F. with a time to clear of 12 seconds. The step-wedge image had 13 $\sqrt{2}$ steps and no development residue was present on the developed samples. MIT etched patterns prepared from PYRALUX AP 8525 all polyimide laminates were well encapsulated. The samples were cured for 1 hour at 160° C. The MIT samples passed bend/crease testing, crosshatch adhesion, and samples passed chemical resistance testing after immersion of the cured samples for 15 minutes in MEK and IPA, but total delamination occurred with testing in 15% sulfuric acid at 40° C. The samples for curl measurement were assessed at 5.7 mm. The thickness after cure was 1.0 mil.

It should be understood that the description of the invention is illustrative only and is representative of the embodiments. For the convenience of the reader, the principles and advantages of the invention have been described in detail, but the description is not exhaustive of all possible variations thereof. Alternative embodiments, according to various aspects of the invention, may not have been presented herein but the absence thereof should not be construed as a disclaimer of those embodiments. One of ordinary skill in the art will appreciate that any changes, substitutions and alterations equivalent to a portion (or all) of the described embodiments may incorporate the principles of the invention without departing from the spirit and scope thereof, as defined by the appended claims.

What is claimed is:

1. A method for preparing, then exposing and then developing a single-layer low-temperature curable photosensitive composition for flexible circuitry applications, comprising the steps of:
   reacting one or more aromatic dianhydrides with one or more aliphatic diamines with a dry solvent to form a polyamic acid solution;
   providing an ethylenically unsaturated photo monomer mixture, comprising a compound selected from the group consisting of: amine (meth)acrylates, amine methacrylamides, and combinations thereof; and, a non-amine-containing (meth)acrylate compound;
   adding the photo monomer mixture, a photo initiator, and a sensitizer to the polyamic acid solution to form a photosensitive composition;
   exposing the photosensitive composition to actinic light to form an exposed composition; and
   developing the exposed composition in 1% aqueous carbonate at 80° C. for use in a flexible circuitry application.

2. The method of claim 1 further comprising the step of curing the composition to form a polyimide having a modulus of less than 2 GPa.

3. A method of making a flexible circuit comprising the steps of:
   reacting one or more aromatic dianhydrides with one or more aliphatic diamines with a dry solvent to form a polyamic acid solution;
   providing an ethylenically unsaturated photo monomer mixture, comprising a compound selected from the group consisting of: amine (meth)acrylates, amine methacrylamides, and combinations thereof; and, a non-amine-containing (meth)acrylate compound;
   adding the photo monomer mixture, a photo initiator, and a sensitizer to the polyamic acid solution to form a photosensitive composition;
   coating the photosensitive composition on a releasable support sheet to form a coated composition;
   laminating the coated composition to a flexible printed circuit substrate;
   exposing the photosensitive composition to actinic light to form an exposed composition; and
   developing the exposed composition in 1% aqueous carbonate at 80° C.

4. The method of claim 3 further comprising the step of curing the composition to form a polyimide having a modulus of less than 2 GPa.

5. The method according to claim 4, wherein polyimide forms an adhesive layer in an electrical circuit.

6. The method according to claim 3 wherein the laminating of the photosensitive composition to the substrate is performed using hot roll lamination with roll temperature at 50° C. with N-methyl pyrrolidone liquid assist.

7. The method according to claim 1 or claim 3, further comprising the step of:
   adding an adhesion promoter to the photosensitive composition prior to adding the photo monomer mixture.

8. The method according to claim 1 or claim 3, further comprising the step of:
   adding a dye to the photosensitive composition prior to adding the photo monomer mixture.

9. The method of claim 2 or claim 4 wherein the curing of the composition is at a temperature of at least 160° C. and up to 200° C. for about one hour.

* * * * *

UNITED STATES PATENT AND TRADEMARK OFFICE
CERTIFICATE OF CORRECTION

PATENT NO.        : 7,524,617 B2                                              Page 1 of 1
APPLICATION NO.   : 10/997701
DATED             : April 28, 2009
INVENTOR(S)       : Thomas Eugene Dueber et al.

It is certified that error appears in the above-identified patent and that said Letters Patent is hereby corrected as shown below:

In Column 2, line 61, please replace "2-mercaptobenzimidazole" with
   -- 2-mercaptobenzimidazole, --.

In Column 2, line 62, please replace "methacrylyloxy" with -- methacryloyloxy --.

In Column 6, line 64, please replace "2-mercaptobenzimidazole" with
   -- 2-mercaptobenzimidazole, --.

In Column 2, line 64, please replace "methacrylyloxy" with -- methacryloyloxy --.

In Column 14, line 7, please replace "$M_N 524,600;$" with -- $M_N$ 524,600; --.

Signed and Sealed this

Eighteenth Day of August, 2009

David J. Kappos
*Director of the United States Patent and Trademark Office*